(12) United States Patent
Shima

(10) Patent No.: US 7,833,866 B2
(45) Date of Patent: Nov. 16, 2010

(54) MANUFACTURE OF SEMICONDUCTOR DEVICE

(75) Inventor: Akio Shima, Hino (JP)

(73) Assignee: Renesas Electronics Corporation, Kanagawa (JP)

( * ) Notice: Subject to any disclaimer, the term of this patent is extended or adjusted under 35 U.S.C. 154(b) by 260 days.

(21) Appl. No.: 11/943,639

(22) Filed: Nov. 21, 2007

(65) Prior Publication Data

US 2008/0145987 A1 Jun. 19, 2008

(30) Foreign Application Priority Data

Dec. 18, 2006 (JP) ............................. 2006-339994

(51) Int. Cl.
*H01L 21/336* (2006.01)
(52) U.S. Cl. ....................... 438/293; 438/224
(58) Field of Classification Search ................. 438/224, 438/293
See application file for complete search history.

(56) References Cited

U.S. PATENT DOCUMENTS

| | | | | |
|---|---|---|---|---|
| 5,512,497 | A * | 4/1996 | Ikeda et al. ................. | 438/233 |
| 6,380,044 | B1 * | 4/2002 | Talwar et al. ............... | 438/308 |
| 2001/0044175 | A1 * | 11/2001 | Barrett et al. .............. | 438/224 |
| 2001/0046757 | A1 * | 11/2001 | Takahashi et al. ........... | 438/518 |
| 2005/0064664 | A1 * | 3/2005 | Shima ........................ | 438/275 |
| 2006/0228897 | A1 * | 10/2006 | Timans ....................... | 438/758 |

FOREIGN PATENT DOCUMENTS

| | | | | |
|---|---|---|---|---|
| JP | 2013075 | * | 1/1987 | ................. 257/413 |
| JP | 10-011674 | | 1/1998 | |
| JP | 10-261792 | | 9/1998 | |
| JP | 2000-077541 | | 3/2000 | |
| JP | 2000-277448 | | 10/2000 | |
| JP | 2001-168341 | | 6/2001 | |
| JP | 2002-289550 | | 10/2002 | |
| JP | 2005-114352 | | 4/2005 | |
| JP | 2005-302883 | | 10/2005 | |

OTHER PUBLICATIONS

Chinese Official Action issued Mar. 25, 2010, in Application No. 200710186827.6.
Chinese Official Action issued Apr. 3, 2009, in Application No. 2007101868276.

* cited by examiner

*Primary Examiner*—Kiesha R Bryant
*Assistant Examiner*—Antonio B Crite
(74) *Attorney, Agent, or Firm*—Antonelli, Terry, Stout & Kraus, LLP.

(57) ABSTRACT

A reflectance-controlling layer whose reflectance to irradiation of laser light becomes lower as a thickness thereof becomes thinner is formed on a semiconductor substrate having a first region and a second region. Thereafter, the reflectance-controlling layer on the first region is etched. Then, a laser light is irradiated to the semiconductor substrate to anneal an $n^-$-type semiconductor region and an $n^+$-type semiconductor region of the first region. In the same manner, after the reflectance-controlling layer is formed on the semiconductor substrate, the reflectance-controlling layer on the second region is etched. Then, a laser light is irradiated to the semiconductor substrate to anneal a $p^-$-type semiconductor region and a $p^+$-type semiconductor region of the second region.

2 Claims, 13 Drawing Sheets

US 7,833,866 B2

MANUFACTURE OF SEMICONDUCTOR DEVICE

CROSS-REFERENCE TO RELATED APPLICATION

The present application claims priority from Japanese Patent Application No. JP 2006-339994 filed on Dec. 18, 2006, the content of which is hereby incorporated by reference into this application.

TECHNICAL FIELD OF THE INVENTION

The present invention relates to a method of manufacturing a semiconductor device and particularly to a technology effectively applied to manufacture of a semiconductor device including an annealing treatment.

BACKGROUND OF THE INVENTION

It is Si (silicon) that is most widely used as a semiconductor substrate at present. For instance, a MISFET (Metal Insulator Semiconductor Field Effect Transistor) is formed on a Si substrate. A method of manufacturing a MISFET is roughly described below. First, a well is formed in a Si substrate, and a gate insulator and also a gate electrode are further formed on the well. Then, impurities having a conductivity type opposite to that of the well are introduced into the well on both sides of the gate electrode by ion-implantation, thereby forming impurity diffusion layers to be a source and a drain. At this time, an annealing treatment is carried out to activate the implanted impurities after the ion-implantation.

Japanese Patent Application Laid-open Publication No. 10-261792 (Patent document 1) describes a technology, in which shallow source and drain diffusion layers, which are aligned with a gate electrode, are formed by the ion-implantation inclined at 30° from a vertical incident angle toward the gate electrode side and the short-time thermal annealing (RTA) is performed for 5 seconds at 950° C., and after the gate sidewall spacers are formed, deep source and drain, which are aligned with the gate sidewall spacers, are formed by the ion-implantation and the short-time RTA is carried out again for 5 seconds at 950° C.

Japanese Patent Application Laid-open Publication No. 2000-77541 (patent document 2) describes a technology in which an RTA treatment is performed for about 10 seconds at 1000° C. in nitrogen atmosphere after the ion-implantation.

Japanese Patent Application Laid-open Publication No. 10-11674 (Patent document 3) describes a technology of controlling the absorption of an excimer laser light energy by means of the thickness of a silicon dioxide layer.

Japanese Patent Application Laid-open Publication No. 2001-168341 (Patent document 4) describes a technology of controlling the absorption of an excimer laser light energy by means of the ratio of $O_x$ and $N_y$ in an $SiO_xN_y$ layer and the thickness of the $SiO_xN_y$ layer.

Japanese Patent Application Laid-open Publication No. 2005-114352 (Patent document 5) describes a technology in which, after an extension of a source and a drain is formed and sidewall insulators are formed on the sidewalls of a gate electrode, a source and a drain are formed by the ion-implantation, and then, in order to activate the implanted impurities, a long-wavelength laser annealing with a wavelength in the range where light absorption by free carrier absorption occurs, that is, the laser annealing with a wavelength of 3 μm or more is carried out.

Meanwhile, an SiC (silicon carbide) substrate has been attracting attentions as a semiconductor substrate for a next-generation semiconductor device, which cannot be realized by an Si substrate due to the limitation of its physical properties. Since the annealing of the SiC substrate with an electric furnace or the like is difficult, restoration of crystallinity and activation of impurities in an ion-implantation layer (semiconductor region) by laser annealing instead of heat annealing have been studied.

Japanese Patent Application Laid-open Publication No. 2000-277448 (Patent document 6) and Japanese Patent Application Laid-open Publication No. 2002-289550 (Patent document 7) describe a technology in which KrF and XeCl excimer laser which has an irradiation power density at which surface elements are not evaporated is irradiated to SiC implanted with ions.

SUMMARY OF THE INVENTION

The reduction in resistance and thickness of source and drain and its extension (ultra-shallow junction) in a MISFET is required for the high integration of LSI (Large Scale Integration). For example, in a transistor having its gate length of 65 nm or less, the junction depth of about 20 nm and the resistance in a range from about 300 to 400 Ω/sq are required.

When an annealing treatment for forming a source and a drain after ion-implantation is performed by the lamp annealing (RTA) described in the patent documents 1 and 2, the implanted impurities diffuse during the annealing. If the impurities diffuse, the junction depth of a formed impurity diffusion layer (semiconductor region) becomes deep. This is a disadvantage for the downsizing and the high integration of a semiconductor device (semiconductor integrated circuit device). For that reason, considering the diffusion of impurities, the dose amount in the ion implantation needs to be reduced in order to make the junction depth of a formed impurity diffusion layer (source and drain and extension thereof) shallow. However, the reduction of dose amount increases the resistance of a formed impurity diffusion layer, and there is a possibility that performance of a semiconductor device is deteriorated.

In the case of the lamp heating using a wavelength at which absorption into Si is slow (low absorption coefficient), it takes a time to raise a temperature of a semiconductor substrate to the predetermined annealing temperature. Therefore, an annealing time (lamp light irradiation time) becomes long.

Also, even in the case of the flash lamp annealing using a wavelength at which absorption into Si is rapid (high absorption coefficient), the lamp heating method requires a time to start up the lamp for emitting the lamp light. Therefore, an annealing time (lamp light irradiation time) becomes longer compared to the laser method described in the patent document 5, for example.

In addition, a short-time irradiation of lamp light is difficult to control. If an irradiation time of the lamp light is reduced, there is a possibility that variation in an annealing temperature is enlarged. Also, in a lamp heating method, since a lamp light has a wider range of wavelength than a laser light, there is a possibility that uneven annealing temperature (uneven temperature distribution) occurs in the surface of a semiconductor wafer. Also, the lamp heating method has its higher limit in an annealing temperature capable of being raised.

Furthermore, if an annealing time is long, the implanted impurities diffuse during the annealing. When the impurities diffuse, the junction depth of a formed impurity diffusion layer becomes deep. This is a disadvantage for the downsizing and the high integration of a semiconductor device (semiconductor integrated circuit device). Accordingly, considering the diffusion of impurities, the dose amount in the ion implantation needs to be reduced in order to make the junction depth of a formed impurity diffusion layer (source and drain, and extension thereof) shallow. However, this reduction in the dose amount increases the resistance of the formed impurity diffusion layer, and there is a possibility that the sheet resistance is increased to, for example, about 2000 to 3000 Ω/sq. In other words, there is a possibility that the performance of LSI (semiconductor device) is deteriorated.

As described above, with the increase in integration of LSI, the gate length of a MISFET becomes short and also the junction depth of an impurity diffusion layer (source and drain, and extension thereof) becomes shallow. As a result, the difference in the impurity diffusion length in the activation annealing treatment after the ion implantation of impurities for forming an n-channel MISFET and a p-channel MISFET such as arsenic (As) and boron (B) becomes unignorable. Therefore, the precise control of the performance of LSI (semiconductor device) is hindered. For instance, there may occur such a case where a heat treatment is optimum for an n-channel MISFET, but not optimum for a p-channel MISFET. Therefore, it becomes necessary to selectively use the heat treatments to respective regions in a chip such as an n-channel MISFET and a p-channel MISFET.

Also in a nickel silicide layer for use in the formation of contacts for a source and a drain and extension thereof having low resistance, in order to meet the requirements of the circuit design, it is necessary to selectively form the layer with different thicknesses for respective regions in a chip such as an n-channel MISFET and a p-channel MISFET. This nickel silicide layer is formed mainly by performing sputtering and then short-time annealing (RTA) such as the lamp annealing, and it is necessary to selectively perform the annealing treatment for respective regions in a chip.

However, in a CMIS (Complementary Metal Insulator Semiconductor), it is impossible to separately perform the activation annealing treatment after the ion implantation for respective regions in a chip such as an n-channel MISFET and a p-channel MISFET, if a batch heating to whole surface such as the lamp annealing is employed.

Incidentally, in high-value-added devices such as a logic device and a memory device which use CMIS to constitute circuits and a BiCMIS device which uses CMIS and bipolar transistors to constitute circuits, CMIS logic portions are formed prior to bipolar portions and memory portions in general. Thus, when the bipolar portions and the memory portions are to be formed without varying the characteristics of the CMIS, heat loads (heat treatment temperature, heat treatment time) to the bipolar portions and the memory portions are restricted. Therefore, an optimum heating process for each device is difficult to be applied to the respective devices. Also, even when heat loads to the bipolar portions and the memory portions are reduced, the variation in characteristics of the CMIS cannot be avoided.

The technologies for selectively annealing the particular portions (CMIS logic portion, bipolar portion, memory portion) of a semiconductor chip are necessary for the solution of these problems. So, the laser annealing using an excimer laser described in the patent documents 3 and 4 has been proposed so as to meet these demands.

However, there exists almost no process margin and process repeatability because an excimer laser light has too high absorption efficiency with respect to Si and the variation in reflectance of excimer laser light with respect to the thickness of a silicon dioxide layer and a $SiO_xN_y$ layer is as small as 20%. Thus, in these technologies, it is practically difficult to perform an annealing treatment by selectively applying heat loads only to the particular portions in a chip.

An object of the present invention is to provide a technology capable of selectively performing the annealing to the predetermined regions on a semiconductor substrate.

A semiconductor device using SiC that has excellent electric characteristics (high withstand voltage, large allowable current), high frequency characteristics, and environmental durability has attracted attentions in recent years. However, in an SiC substrate, an annealing treatment with an extremely high temperature of 1500° C. or more is required for activating the impurities. Although an electric furnace or the like is utilized in general, since a very long time is required for reaching the high temperature in such a high-temperature heat annealing, the productivity is low. Further, there exist various problems such as residue of large crystal defects after the high-temperature treatment, evaporation of surface Si elements due to the high-temperature treatment, and redistribution of the ion-implanted impurities. Accordingly, it is difficult to obtain good device characteristics.

For its solution, as described in the patent documents 6 and 7, restoration of crystallinity and activation of impurities in an ion-implantation layer by laser annealing have been examined as an alternative because it is difficult to perform the annealing with an electric furnace or the like in an SiC substrate.

However, in these conventional technologies, the ion-implantation is performed at very low energies such as 50 keV for $Al^+$ ion and 30 keV for $N^+$ ion, and the depth of ion-implantation layers is both about 50 nm and comparatively shallow. The above problem is caused due to that the laser light penetration length into an SiC substrate is several tens nm and very shallow and the absorption itself is insufficient because the light with a wavelength of KrF and XeCl excimer laser has a high reflectance with respect to an SiC substrate.

Another object of the present invention is to provide a technology capable of effectively performing the impurity activation by using laser annealing to an SiC substrate.

The above and other objects and novel characteristics of the present invention will be apparent from the description of this specification and the accompanying drawings.

The typical ones of the inventions disclosed in this application will be briefly described as follows.

In the method of manufacturing a semiconductor device according to the present invention, first, low-concentration semiconductor regions (extension of source and drain) each having a part located below a gate electrode are formed by performing ion-implantation to a semiconductor substrate. Then, after sidewall insulators are formed on the sidewalls of the gate electrode, high-concentration semiconductor regions (source and drain) are formed by performing ion-implantation. Subsequently, a reflectance-controlling layer having a thickness controlled so as to minimize the reflectance of annealing light on a first region and maximize the reflectance of annealing light on a second region is formed on the entire surface of the substrate. Then, a long-wavelength laser annealing treatment with a wavelength of 3 μm or more is performed in order to activate the implanted impurities. In this case, a layer having a complex component k of 1 or more in a complex refractive index n+ik in a wavelength of the light to be used is used as the reflectance-controlling layer.

The effects obtained by typical aspects of the present invention will be briefly described below.

In the manufacturing technology of a semiconductor device according to the present invention, annealing can be selectively performed to the predetermined regions in a semiconductor substrate.

DESCRIPTION OF THE PREFERRED EMBODIMENT

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Manufacturing process of a semiconductor device according to the first embodiment will be described with reference to the drawings. FIG. 1 to FIG. 8 are cross-sectional views showing a principal part of a semiconductor device according to an embodiment of the present invention, for example, the manufacturing process of CMIS.

Figure 1:
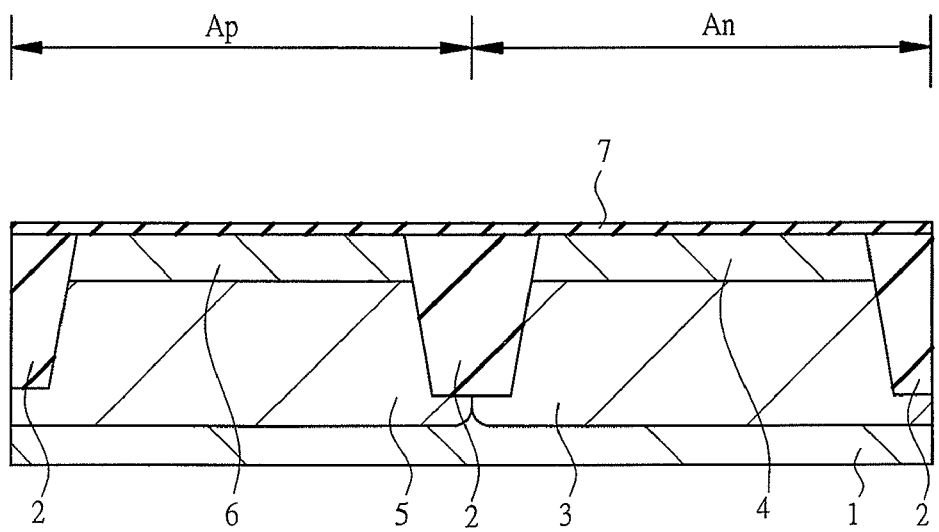
FIG. 1 is a cross-sectional view showing the principal part of a semiconductor device in a manufacturing process according to an embodiment of the present invention.

First, as shown in FIG. 1, for instance, a semiconductor substrate 1 made of p-type single-crystal silicon and having a resistivity in a range from about 1 to 10 Ωcm is prepared. This semiconductor substrate 1 has a region Ap on which a p-channel MISFET (hereinafter, referred to as pMIS) is formed and a region An on which an n-channel MISFET (hereinafter, referred to as nMIS) is formed. In other words, a pMIS and an nMIS which constitute a CMIS are formed on the main surface of this semiconductor substrate 1.

Then, an element isolation region 2 is formed in the main surface of the semiconductor substrate 1. The element isolation region 2 is made of silicon dioxide or the other materials and is formed by a well-known STI (Shallow Trench Isolation) method or LOCOS (Local Oxidization of Silicon) method.

Then, a p-type well 3 is formed by using photolithography and ion-implantation in the region An of the semiconductor substrate 1 where an nMIS is to be formed. The p-type well 3 is formed by ion-implanting a p-type impurity such as boron (B) and by other steps. Thereafter, if necessary, an ion-implantation for threshold voltage control of the nMIS to be formed later and a heat treatment for activation of the implanted impurities are performed, and a threshold voltage-controlling layer 4 is formed on the surface of the p-type well 3.

Then, an n-type well 5 is formed by using photolithography and ion-implantation in the region Ap of the semiconductor substrate 1 where a pMIS is to be formed. The n-type well 5 is formed by ion-implanting an n-type impurity such as phosphorus (P) and by other steps. Thereafter, if necessary, an ion-implantation for threshold voltage control of the pMIS to be formed later and a heat treatment for activation of the implanted impurities are performed, and a threshold voltage-controlling layer 6 is formed on the surface of the n-type well 5.

Then, a gate insulator 7 is formed on the surface of the semiconductor substrate 1. The gate insulator 7 is made of, for example, a thin silicon dioxide layer and can be formed by, for example, a thermal oxidation method. Alternatively, by nitriding the surface of a thermal oxide layer with NO gas or others, the gate insulator 7 formed of a stacked layer consisting of a silicon oxide and its upper silicon nitride layer can be formed. Further, the gate insulator 7 can be formed from a silicon oxynitride layer.

Figure 2:
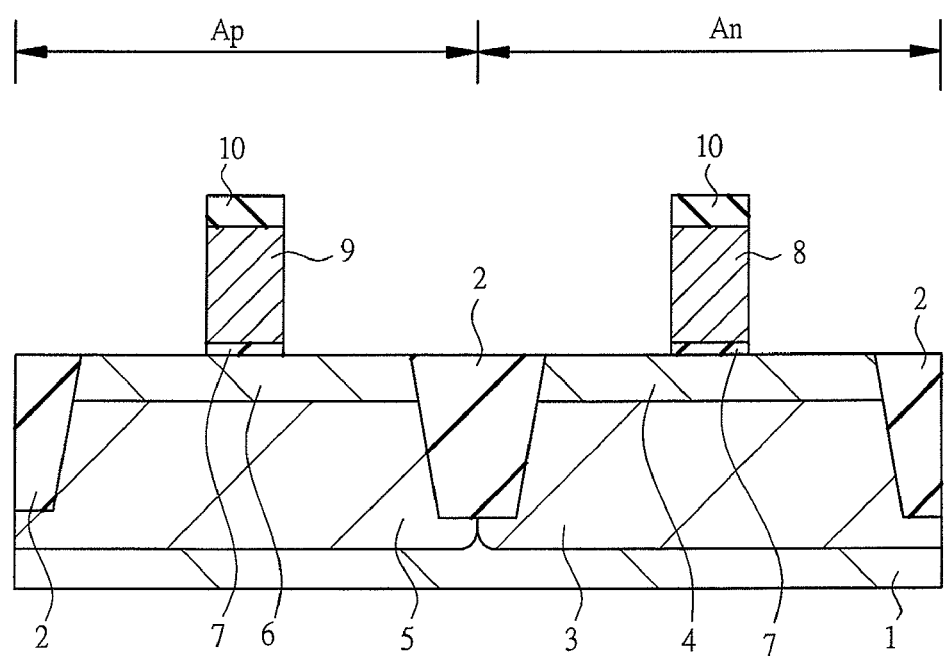
FIG. 2 is a cross-sectional view showing the principal part of a semiconductor device in a manufacturing process continued from FIG. 1.

Next, as shown in FIG. 2, gate electrodes 8 and 9 are formed on the gate insulators 7. For example, a polysilicon layer and a protection layer 10 (for example, a silicon dioxide layer) are sequentially formed by a CVD (Chemical Vapor Deposition) method or the other methods on the semiconductor substrate 1, and impurities are implanted into the polysilicon layer by using photolithography and ion-implantation. Thereafter, the protection layer 10 and the conductive polysilicon layer are patterned by photolithography and dry etching. By this means, the gate electrodes 8 and 9 made of the conductive polysilicon layer are formed. The protection layer 10 is formed on each of the gate electrodes 8 and 9 and can function as protection layers for the gate electrodes 8 and 9.

Figure 3:
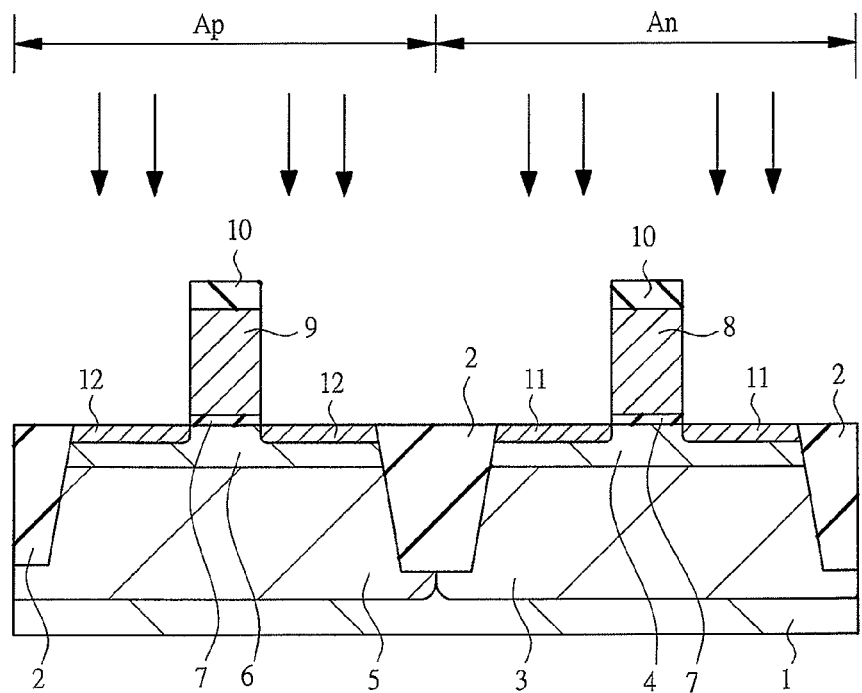
FIG. 3 is a cross-sectional view showing the principal part of a semiconductor device in a manufacturing process continued from FIG. 2.

Next, as shown in FIG. 3, (one pair of) n⁻-type semiconductor regions 11 (impurity diffusion layers, i.e. extension of source and drain) and (one pair of) p⁻-type semiconductor regions 12 (impurity diffusion layers, i.e. extension of source and drain) are formed by using photolithography and ion-implantation.

For example, the n⁻-type semiconductor regions 11 are formed by ion-implanting (ion-implantation) an n-type impurity such as arsenic (As) into the regions on both sides of the gate electrode 8 on the p-type well 3. As the conditions of the ion-implantation, for example, an acceleration energy is about 3 keV and the amount of implantation ions (dose amount) is about $1 \times 10^{15}/cm^2$. In addition, in the ion-implantation process for the extensions of the source and drain, since the gate electrode 8 and the protection layer 10 can function as an implantation-blocking mask, the n⁻-type semiconductor regions 11 are formed in a self-aligned manner with respect to the gate electrode 8. Consequently, the n⁻-type semiconductor regions 11 are formed on both sides of the gate electrode 8 so as to be in contact with the channel region of the nMIS.

Meanwhile, the p⁻-type semiconductor regions 12 are formed by ion-implanting a p-type impurity such as boron (B) in the same manner as that of the n⁻-type semiconductor regions 11.

Figure 4:
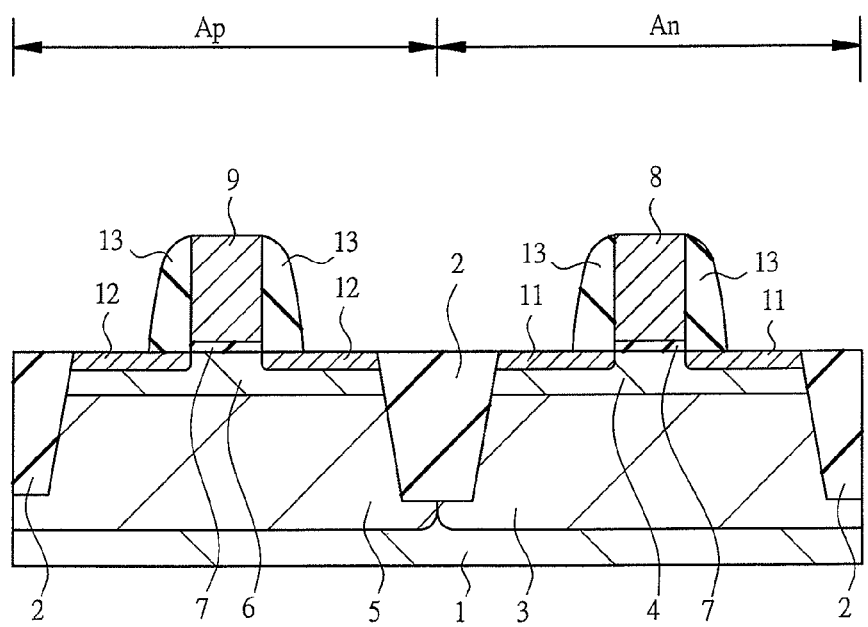
FIG. 4 is a cross-sectional view showing the principal part of a semiconductor device in a manufacturing process continued from FIG. 3.

Next, as shown in FIG. 4, sidewalls 13 (sidewall spacer, sidewall insulator) made of an insulator such as a silicon dioxide layer or a silicon nitride layer or a stacked layer thereof are formed on the sidewalls of the gate electrodes 8 and 9. The sidewall 13 can be formed by, for example, depositing an insulator (silicon dioxide layer, silicon nitride layer, or stacked layer thereof) on the semiconductor substrate 1 and then performing the anisotropic etching to the insulator.

Figure 5:
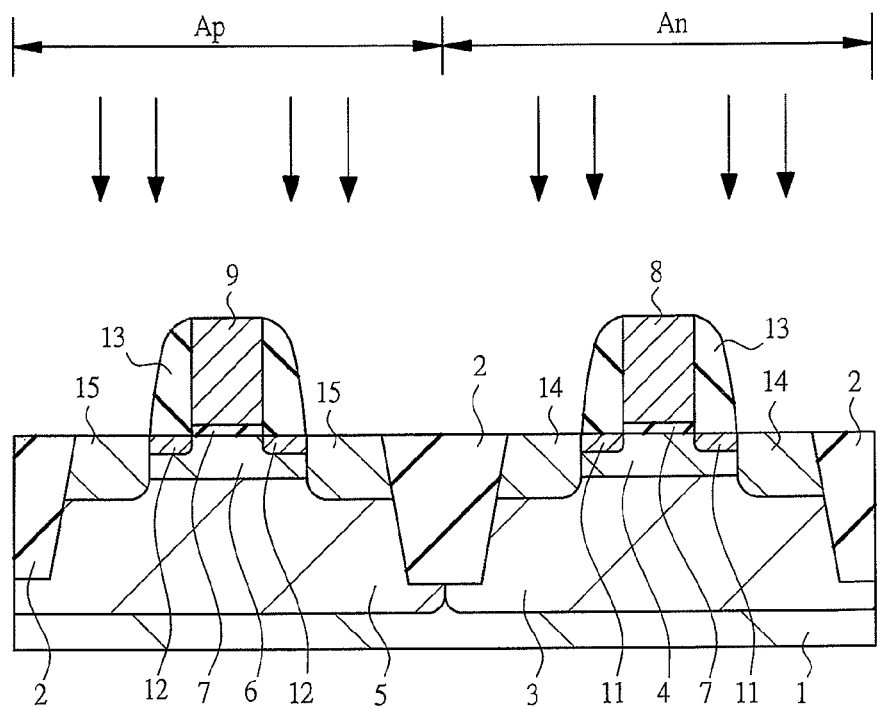
FIG. 5 is a cross-sectional view showing the principal part of a semiconductor device in a manufacturing process continued from FIG. 4.

Next, as shown in FIG. 5, (one pair of) n⁺-type semiconductor regions 14 (impurity diffusion layers, i.e. source and drain) and (one pair of) p⁺-type semiconductor regions 15 (impurity diffusion layers, i.e. source and drain) are formed by using photolithography and ion-implantation.

For example, the n⁺-type semiconductor regions 14 are formed by ion-implanting (ion-implantation) an n-type impurity such as arsenic (As) into the regions on both sides of the gate electrode 8 and the sidewalls 13 on the p-type well 3. In this ion-implantation, as schematically shown in FIG. 5, impurities can be ion-implanted into the regions on both sides of the gate electrode 8 and the sidewalls 13 on the p-type well 3 from the direction vertical to the main surface of the semiconductor substrate 1. As the conditions of the ion-implantation, for example, an acceleration energy is about 10 keV and the amount of implantation ions (dose amount) is $5 \times 10^{15}/cm^2$.

For that reason, the impurity concentration in the n⁺-type semiconductor region 14 is higher than that in the n⁻-type semiconductor region 11. Also, the junction depth of the n⁺-type semiconductor region 14 (depth or thickness in the direction vertical to the main surface of the semiconductor substrate 1) is deeper (thicker) than the junction depth of the n⁻-type semiconductor region 11 (depth or thickness in the direction vertical to the main surface of the semiconductor substrate 1). In other words, compared to the n⁺-type semiconductor region 14, the n⁻-type semiconductor region 11 has lower impurity concentration and is formed shallower in depth. For example, when the acceleration energy of an ion-implantation for the n⁻-type semiconductor region 11 is set lower than that of an ion-implantation for the n⁺-type semiconductor region 14, the junction depth of the n⁻-type semiconductor region 11 can be made shallower than that of the n⁺-type semiconductor region 14.

Also, in the ion-implantation process for a source and a drain, since the gate electrode 8 and the sidewalls 13 can function as an implantation-blocking mask, the n⁺-type semiconductor region 14 is formed in a self-aligned manner with respect to the sidewall 13. Therefore, the n⁺-type semiconductor regions 14 which are connected to the n⁻-type semiconductor regions 11 are formed on both sides of the gate electrode 8 so that the end portions of the n⁺-type semiconductor regions 14 are separated from the bottoms of the sidewalls of the gate electrode 8 and also separated from the channel region of the nMIS via the n⁻-type semiconductor regions 11.

Meanwhile, the p⁺-type semiconductor regions 15 are also formed by ion-implanting a p-type impurity such as boron (B), in the same manner as that of the n⁺-type semiconductor region 14.

Figure 6:
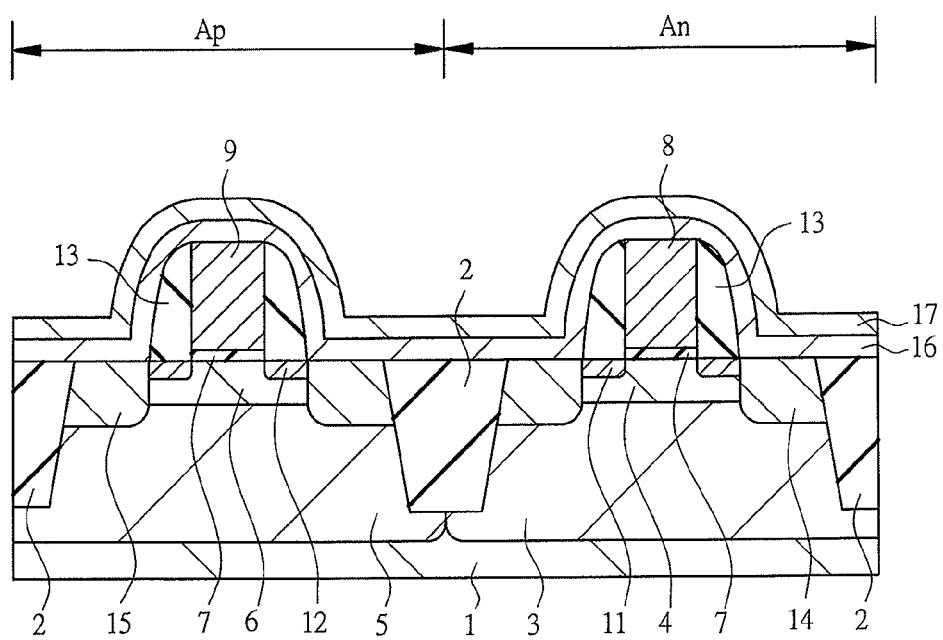
FIG. 6 is a cross-sectional view showing the principal part of a semiconductor device in a manufacturing process continued from FIG. 5.

Next, as shown in FIG. 6, after a surface-protection layer 16 is deposited on the semiconductor substrate 1 having the region An where an nMIS is to be formed and the region Ap where a pMIS is to be formed, a reflectance-controlling layer 17 is deposited on the surface-protection layer 16.

The surface-protection layer 16 is formed for the purpose of preventing the reflectance-controlling layer 17 and the underlying semiconductor substrate 1 from reacting with each other, and a chemically and thermally stable material is used for the surface-protection layer 16. For example, a silicon dioxide layer having a thickness of about 10 nm deposited by a CVD method is used for the surface-protection layer 16. Alternatively, an alumina ($Al_2O_3$) layer, a silicon nitride layer, or a stacked layer made of these layers and a silicon dioxide layer can be used as the surface-protection layer 16.

The reflectance-controlling layer 17 is a layer whose reflectance with respect to the irradiation from a light source becomes lower as its thickness decreases. For example, when a laser as a light source which irradiates a light having a particular wavelength is used, a material having a sufficiently high reflectance in a wavelength of the laser to be used such as metal is used for the reflectance-controlling layer 17. In this case, for example, a tungsten (W) layer having a thickness of 100 nm deposited by a sputtering method is used. However, other metal layers can be used. In addition to a metal layer, any layer can be used as long as it has the complex component k of 1 or more in the complex refraction index n+ik in a wavelength of the used laser.

Figure 7:
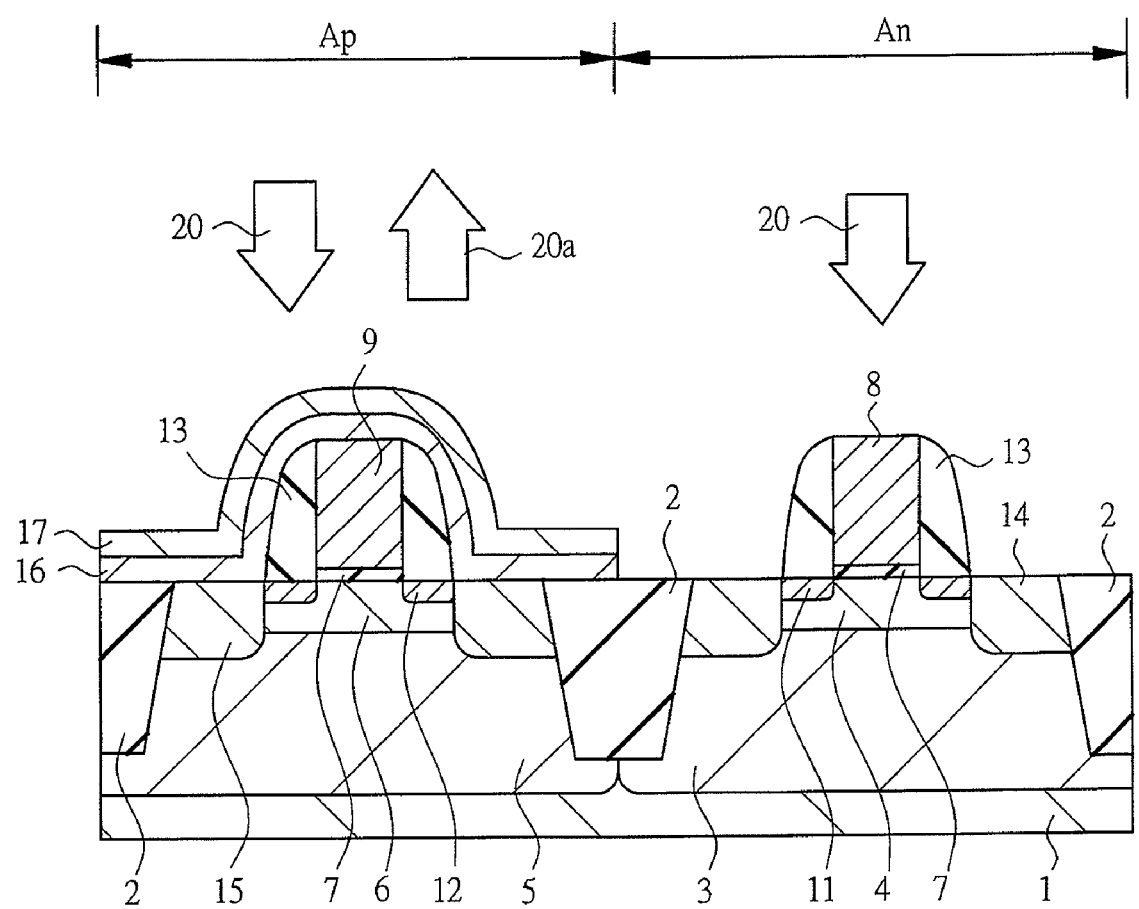
FIG. 7 is a cross-sectional view showing the principal part of a semiconductor device in a manufacturing process continued from FIG. 6.

Next, as shown in FIG. 7, a part of the reflectance-controlling layer 17, that is, only a part of the reflectance-controlling layer 17 on the nMIS formation region An is removed by etching (dry etching or wet etching) using a photoresist layer as a mask, and the reflectance-controlling layer 17 is left only on the pMIS formation region Ap that should be prevented from being heated in a later annealing process.

Then, a light (laser light 20) with a particular wavelength is irradiated to the semiconductor substrate 1 to perform an annealing treatment to the nMIS formation region An. Note that the laser light 20 as well as a reflecting light 20a which occurs when the laser light 20 as an incident light is reflected by the reflectance-controlling layer 17 are shown in FIG. 7.

In this annealing treatment, a long-wavelength laser annealing is performed under the conditions at 1350° C. for 800 μs in order to activate the impurities implanted into the n⁻-type semiconductor region 11 and the n⁺-type semiconductor region 14 by the ion-implantation. The long-wavelength laser annealing is an annealing treatment (heat treatment) using a laser with a long wavelength, and the wavelength of the used laser (laser light 20) is preferably 3 μm or more, more preferably 5 μm or more, and even more preferably 8 μm or more. For example, $CO_2$ gas laser (wavelength: 10.6 μm) can be used to perform the annealing treatment.

In addition, the annealing temperature is preferably 1000° C. or more, more preferably 1100° C. or more, and even more preferably 1200° C. or more. Further, the annealing time is preferably 100 msec (100 milliseconds) or less, more preferably 10 msec or less, and even more preferably 1 msec or less. Furthermore, for example, this annealing treatment can be carried out in a nitrogen ($N_2$) atmosphere. However, other gases (for instance, inert gases) are also available.

After the annealing treatment to the nMIS formation region An, the reflectance-controlling layer 17 and the surface-protection layer 16 are removed by a well-known wet etching method or the like to return to the state in FIG. 5, and the manufacturing steps in FIG. 6 and FIG. 7 are sequentially performed. In these steps, in contrast to the previously-mentioned steps, the reflectance-controlling layer 17 is partially left only on the nMIS formation region An that should be prevented from being heated, and the long-wavelength laser annealing is carried out under the conditions at 1250° C. for 800 μs in order to activate the impurities implanted into the p⁻-type semiconductor region 12 and the p⁺-type semiconductor region 15 by the ion-implantation.

By this means, the nMIS is formed on the region An and the pMIS is formed on the region Ap of the semiconductor substrate 1. The n⁺-type semiconductor region 14 and the n⁻-type semiconductor region 11 can function as a source or a drain of the nMIS. Also, the p⁺-type semiconductor region 15 and the p⁻-type semiconductor region 12 can function as a source or a drain of the pMIS. In addition, the n⁻-type and p⁻-type semiconductor regions 11 and 12 can function as the extension of a source or a drain.

As described above, the region to be annealed can be heated to the desired annealing temperature by irradiating a long-wavelength laser to the main surface (to the predetermined region of the main surface) of the semiconductor substrate 1. In the first embodiment, since the long-wavelength laser annealing is used as an annealing treatment for activating impurities, the rise of temperature to a higher temperature can be performed in a shorter time in comparison with RTA such as ramp annealing, and an annealing treatment at high temperature and in a short time can be achieved. Therefore, the resistance of the activated impurity diffusion layers (n⁻-type and p⁻-type semiconductor regions 11 and 12 and n⁺-type and p⁺-type semiconductor regions 14 and 15) can be lowered and the diffusion of the implanted impurities can be prevented, and the junction depth of the impurity diffusion layers (n⁻-type and p⁻-type semiconductor regions 11 and 12 and n⁺-type and p⁺-type semiconductor regions 14 and 15, in particular, n⁻-type and p⁻-type semiconductor regions 11 and 12) can be made shallower. In other words, the formation of a shallow junction (ultra-shallow junction) can be achieved. For that reason, it is advantageous for the downsizing and the high integration of a semiconductor device.

Note that, although process selectivity for each nMIS and pMIS is taken as an example in FIG. 7 of the first embodiment, a selective annealing for only source and drain or only a poly-gate is also possible in the same manner.

Figure 8:
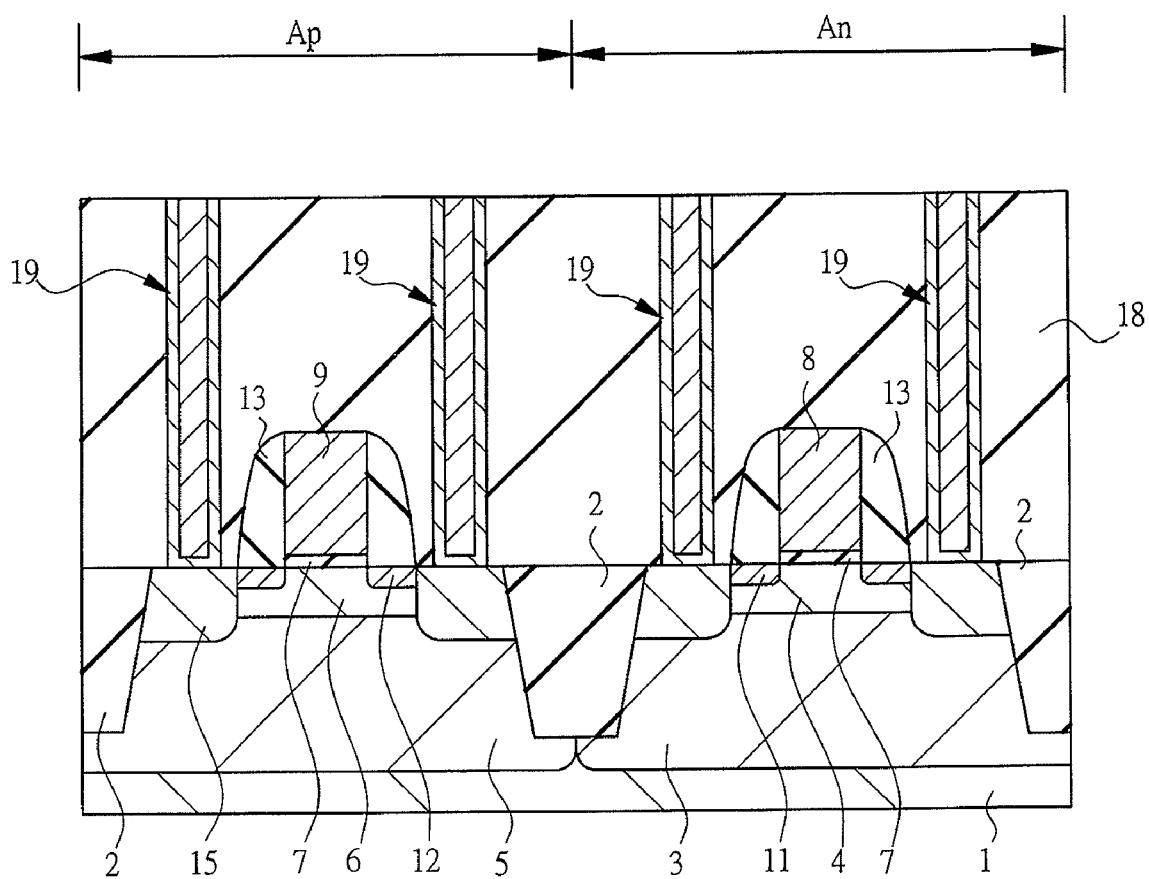
FIG. 8 is a cross-sectional view showing the principal part of a semiconductor device in a manufacturing process continued from FIG. 7.

Next, as shown in FIG. 8, a selective nickel silicide (NiSi) layer is formed on the gate electrodes 8 and 9 and the source and drain (n⁺-type semiconductor region 14 and p⁺-type semiconductor region 15) by a conventional method. Then, the deposition of an interwiring insulating layer 18 and polishing for planarization are performed. Thereafter, after holes are formed in desired regions, wiring metal is embedded into the holes, and the planarization thereof is performed, thereby forming plugs 19. Then, the wiring process including the source electrodes and drain electrodes and others are performed, whereby a semiconductor device is manufactured.

Incidentally, as a method different from the first embodiment, the utilization of a short-wavelength laser such as an excimer laser (for example, wavelength of 308 nm) for annealing may be proposed. In the case of an excimer laser, however, since the light with a wavelength of an excimer laser has a high transmittance to a silicon dioxide layer, the following problems may occur, that is: (1) a silicon region under the element isolation region is dissolved; (2) a gate electrode made of a semiconductor material such as polysilicon is also dissolved; and (3) dependence on the difference in fineness of patterns (for example, the pattern of gate electrodes) and on underlying materials (for example, Si substrate and silicon dioxide layer) occurs. These problems make it difficult to activate impurities implanted into a semiconductor substrate by a short-wavelength laser such as an excimer laser in order to form a source and a drain.

For the purpose of avoiding these problems, Japanese Patent Application Laid-open Publication No. 10-11674 (Patent document 3) describes a technology of controlling the absorption of an excimer laser light energy by means of the thickness of a silicon dioxide layer. Also, Japanese Patent Application Laid-open Publication No. 2001-168341 (Patent document 4) describes a technology of controlling the absorption of an excimer laser light energy by means of the ratio of $O_x$ and $N_y$ in an $SiO_xN_y$ layer and the thickness of the $SiO_xN_y$ layer. However, there exists almost no process margin and process repeatability because an excimer laser light has too high absorption efficiency with respect to Si and the variation in reflectance with respect to the thickness of a layer is as small as 20%. Thus, in these technologies, it is practically difficult to perform an annealing treatment by selectively applying heat loads only to the particular portions in a chip.

Figure 9:
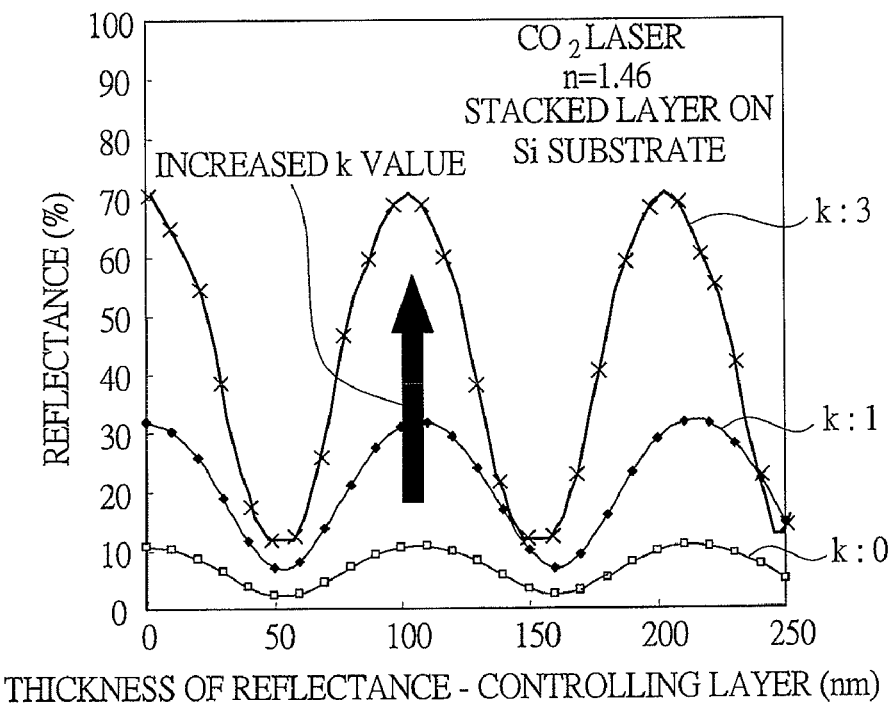
FIG. 9 is an explanatory view showing the dependence on thickness and reflectance of a reflectance-controlling layer with respect to the reflectance variation of a long-wavelength laser in an Si substrate.

FIG. 9 shows the relationship between the thickness and the reflectance of layered structure deposited on an Si substrate in the case of using $CO_2$ gas laser as a long-wavelength laser. The dependence on k when the value n in the complex refraction index n+ik of the deposited layer is set to 1.46 is represented here.

Figure 10:
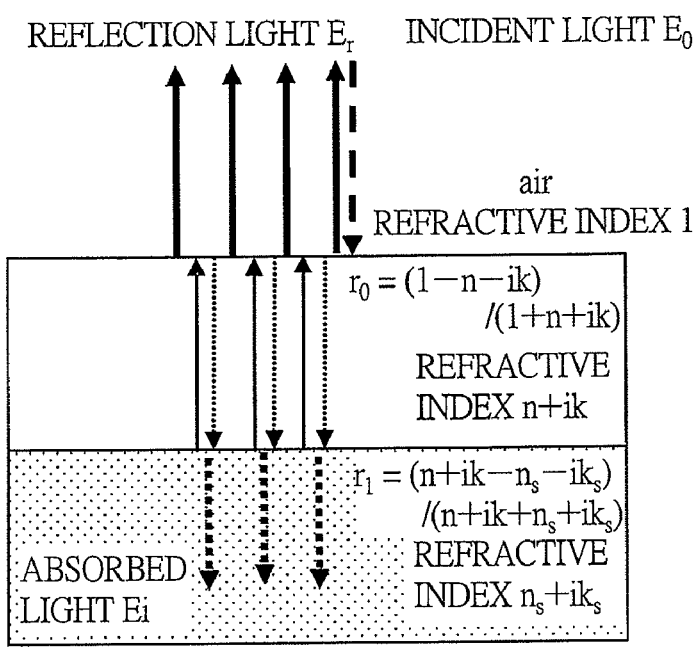
FIG. 10 is an explanatory view showing a process of experiment of FIG. 9.

Note that, on the assumption that the reflection electric-field Er caused by a stacked thin layer and multiple reflections is regarded as (reflection light at the interface with the air)+(light obtained when the reflection light at the interface with the substrate passes through the interface with the air)+(light obtained when the reflection light reflected by the substrate is reflected at the interface with the air and then reflected again by the substrate and passes through the interface with the air)+ . . . , under the setting shown in FIG. 10, the reflection electric-field Er and the reflectance r are represented as follows.

$$E_r = E_0\{r_0 + r_1 \exp(i2\phi)\}/\{1 + r_1 r_0 \exp(i2\phi)\}$$

$$r = E_r/E_0 = \{r_0 + r_1 \exp(i2\phi)\}/\{1 + r_1 r_0 \exp(i2\phi)\}$$

Here, $\phi$ indicates the light phase change in passing through the layer, and $\phi=2\pi(n+ik)d/\lambda$.

As is understood from FIG. 9, depending on the thickness of a reflectance-controlling layer, a reflectance changes between about 10% and about 30% in the case of the value of k=1 and between about 10% and about 70% in the case of the value of k=3. As described above, in a layer having the complex component k being 1 or more with respect to the particular wavelength of a laser light, the maximum difference in reflectance becomes 70% depending on a layer thickness, and the reflectance greatly changes compared to the cited patent applications using the excimer laser to an $SiO_xN_y$ layer (maximum fluctuation in reflectance of 20%). For utilizing this fluctuation in reflectance, for example, reflectance-controlling layers each having the thicknesses capable of achieving the minimum reflectance and the thickness capable of achieving the maximum reflectance are formed on a semiconductor substrate having a first region and a second region, respectively. By doing so, when a laser light is irradiated to the semiconductor substrate to perform the annealing treatment, the annealing is performed more effectively on the first region where the reflectance is minimum compared with on the second region where the reflectance is maximum. In other words, it can be understood that, when a reflectance-controlling layer (value of k is 1 or more) whose reflectance to the irradiation of laser light becomes lower as its thickness decreases is used, high selectivity of annealing can be obtained more effectively than the case where a normal $SiO_2$ layer (value of k is 0.1 or less) or the like is used.

Accordingly, if the thickness of the reflectance-controlling layer is controlled so that the minimum reflectance is achieved on a region where a heat treatment is required, the light transmittance increases, and a heating temperature rises on this region. Meanwhile, if the thickness of the reflectance-controlling layer is controlled so that the maximum reflectance is achieved on a region where a heat treatment is not substantially required, the light transmittance decreases, and a heating temperature falls on this region. Under the conditions of FIG. 9, the thicknesses of the reflectance-controlling layers are defined to be 50 nm on a region where a heat treatment is required and to be 0 nm (not formed) on a region where a heat treatment is not substantially required.

As described above, the reflectance-controlling layer is a layer whose reflectance with respect to the irradiation of the light with the predetermined wavelength becomes lower as the layer thickness thereof decreases.

Incidentally, when a laser with a wavelength of 3 μm or more is used as a long-wavelength laser, a complex component k in the complex refraction index n+ik becomes a value of 3 or more with respect to a conventional metal layer such as Al, W, Ti and Ni that are widely used in the present semiconductor industry, and its reflectance is almost 100% when the layer thickness is 50 nm or more. In other words, these layers are the simplest reflectance-controlling layers.

Figure 11:
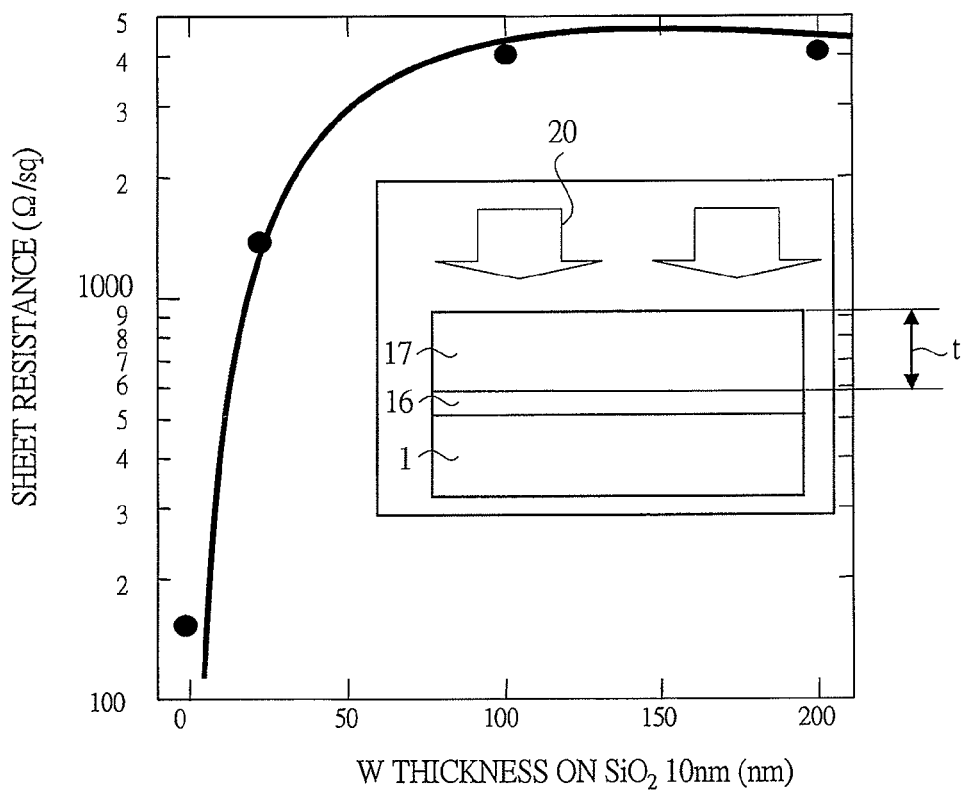
FIG. 11 is an explanatory view showing the dependence on a reflectance-controlling layer thickness with respect to a sheet resistance of an ion-implantation layer which is annealed by a long-wavelength laser.

FIG. 11 shows the dependence on tungsten (W) layer thickness in irradiating the long-wavelength laser light 20 to the semiconductor substrate 1 in the case where an $SiO_2$ layer having a thickness of about 10 nm as the surface-protection layer 16 is formed on an ion-implantation layer (boron, 5 keV, $2\times10^{15}$ cm$^{-2}$) of the semiconductor substrate 1 and tungsten (W) as the reflectance-controlling layer 17 is deposited thereon. In the graph of FIG. 11, the vertical axis represents a sheet resistance (activation rate) of the ion-implantation layer and the horizontal axis represents a thickness of the reflectance-controlling layer 17. In this case, $CO_2$ gas laser is used as the long-wavelength laser under the conditions at 1300° C. for 800 μs.

As shown in FIG. 11, as the thickness of the reflectance-controlling layer 17 increases, the sheet resistance also increases, and when the thickness of the stacked layer reaches 50 nm or more, the sheet resistance becomes as high as about 4 kΩ/sq in a saturated state. In other words, it can be understood that the ion-implantation layer is not heated and not annealed. Since the reflectance with respect to the long-wavelength laser light 20 is increased and the sheet resistance is saturated by increasing the thickness of the reflectance-controlling layer 17, the reflectance reaches almost 100% when the reflectance-controlling layer 17 is stacked to be 50 nm or more. In other words, as the thickness of the reflectance-controlling layer 17 decreases, the reflectance with respect to the irradiation of the long-wavelength laser light 20 decreases.

Figure 12:
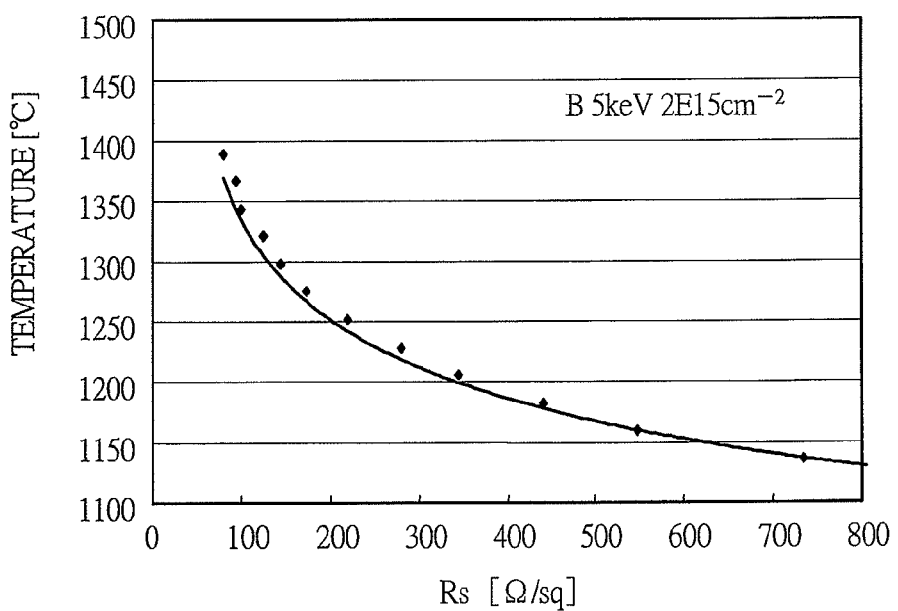
FIG. 12 is a graph showing a sheet resistance of an impurity diffusion layer formed by ion-implantation and subsequent long-wavelength laser annealing.

FIG. 12 shows the dependence on temperature with respect to a sheet resistance in irradiating the long-wavelength laser light 20 to the semiconductor substrate 1 in the case where the reflectance-controlling layer 17 is not formed on the ion-implantation layer (boron, 5 keV, $2\times10^{15}$ cm$^{-2}$) on the semiconductor substrate 1 of FIG. 11. In the graph of FIG. 12, the vertical axis represents an annealing temperature and the horizontal axis represents the sheet resistance (activation rate) of the ion-implantation layer. In this case, $CO_2$ gas laser is used as the long-wavelength laser under the condition for 800 μs.

As shown in FIG. 12, as the annealing temperature becomes lower, the sheet resistance increases. In other words, it can be understood that, since the reflectance-controlling layer 17 is not formed, the long-wavelength laser light 20 reaches the ion-implantation layer and the sheet resistance varies depending on the annealing temperature.

Therefore, as is understood from FIG. 11 and FIG. 12, when the reflectance-controlling layer 17 is stacked to have a thickness of 50 nm or more, the sheet resistance reaches and is fixed to about 4 kΩ/sq, that is, the long-wavelength laser light 20 is reflected by the reflectance-controlling layer 17 at almost 100%, and the transmission light thereof does not reach the ion-implantation layer.

In the first embodiment, the case where different annealing conditions are applied to each of nMIS and pMIS has been described. However, an annealing treatment described below is also possible. For example, as with the case shown in FIG. 7, while the reflectance-controlling layer 17 of the nMIS formation region An is not formed (thickness of 0 nm), the reflectance-controlling layer 17 on the pMIS formation region Ap is formed to be as thin as about 20 nm, and the long-wavelength laser annealing is performed to the nMIS formation region An at 1350° C. for 800 μs. At this time, the laser light is reduced by the reflectance-controlling layer 17 on the pMIS formation region Ap and the effective heating temperature in the region Ap falls to 1250° C. for 800 μs. In this manner, the annealing conditions can be effectively changed to each part of the semiconductor substrate without the repetition of formation and removal of the surface-protection layer 16 and the reflectance-controlling layer 17.

Figure 13:
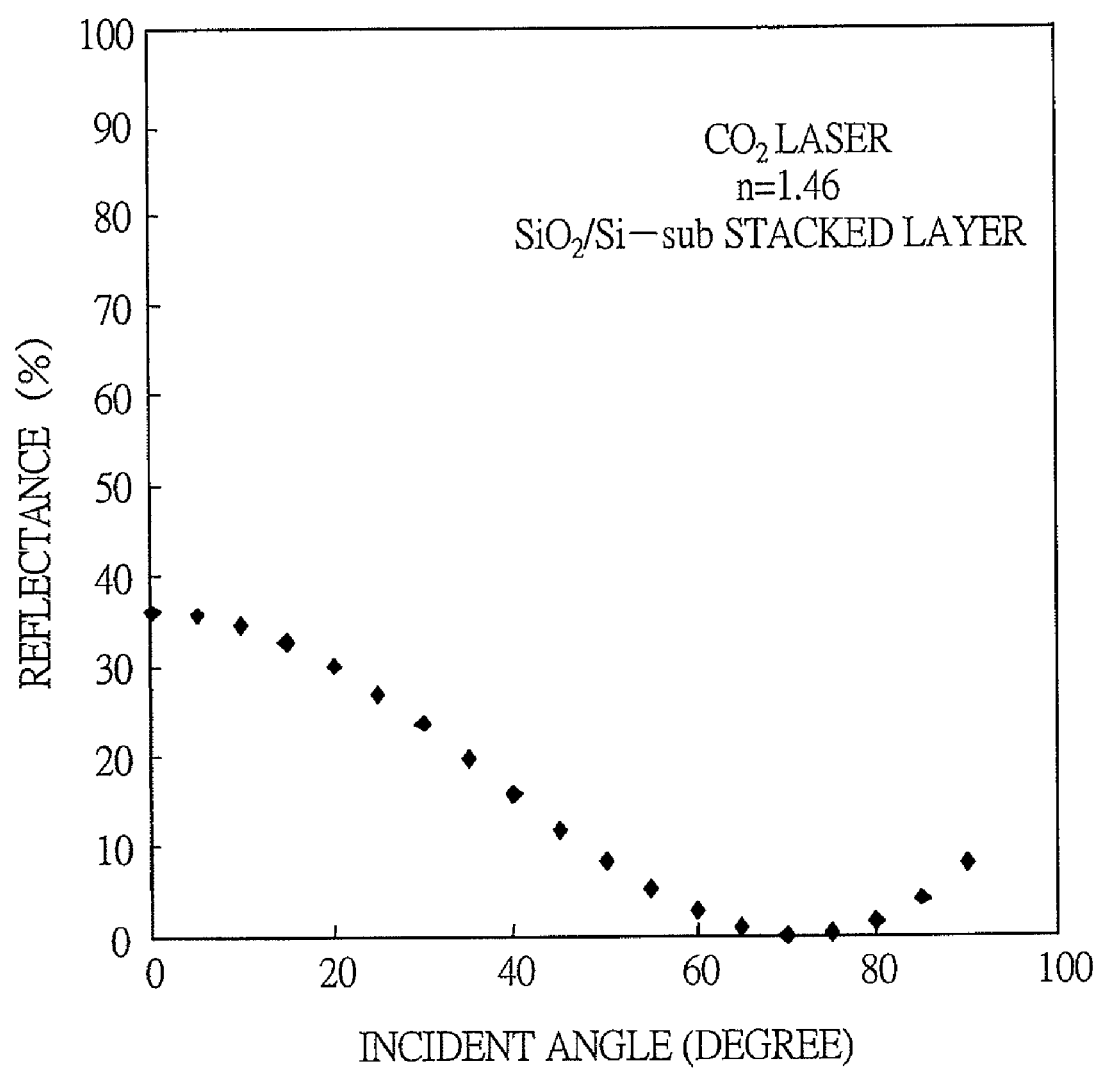
FIG. 13 is a graph showing the dependence on a reflectance with respect to a reflectance-controlling layer.

Also, in the present invention, a laser light may be irradiated in a direction inclined from the normal line of the substrate. However, this is not effective when the values of n and k in the complex refractive index n+ik are small. By way of example, the relationship between the thickness of an $SiO_2$ layer and reflectance in the case where a $CO_2$ gas laser as the long-wavelength laser is irradiated to the $SiO_2$ layer (n=1.46, value of k is 0.1 or less) on the semiconductor substrate 1 made of Si is shown in FIG. 13. As is apparent from FIG. 13, reflectance becomes the largest in the irradiation from the direction of the normal line of the substrate, and a periodicity depending on the layer thickness can clearly appear, that is to say, the most effective effect of the present invention can be obtained.

As a method different from the first embodiment, the utilization of the lamp heating (lamp annealing) for the annealing treatment after the ion-implantation may be proposed. However, since a light with a wavelength of a tungsten halogen lamp that is conventionally used for the lamp annealing is absorbed into a semiconductor substrate region, an annealing that selectively applies a heat load to a particular part in a chip as described in the present invention is difficult.

On the other hand, in the first embodiment, a long-wavelength laser annealing is used in the annealing treatment after the ion-implantation. The laser annealing which is an annealing treatment using a laser method is capable of raising a temperature locally by irradiating the laser light and is capable of instantly raising a temperature in a specified region because it uses the focusing characteristic of the laser light. Therefore, the laser annealing can shorten an annealing time (heating time, laser irradiation time) in comparison with the lamp annealing or others. Since the annealing time can be shortened, the diffusion of the implanted impurities during the annealing can be suppressed or prevented. For that reason, the junction depth of a formed impurity diffusion layer can be made shallow. Also, it is easy to control the short-time irradiation of a laser light because of a laser method, and even when a laser irradiation time is short, the variation of annealing temperature can be made comparatively small.

Figure 14:
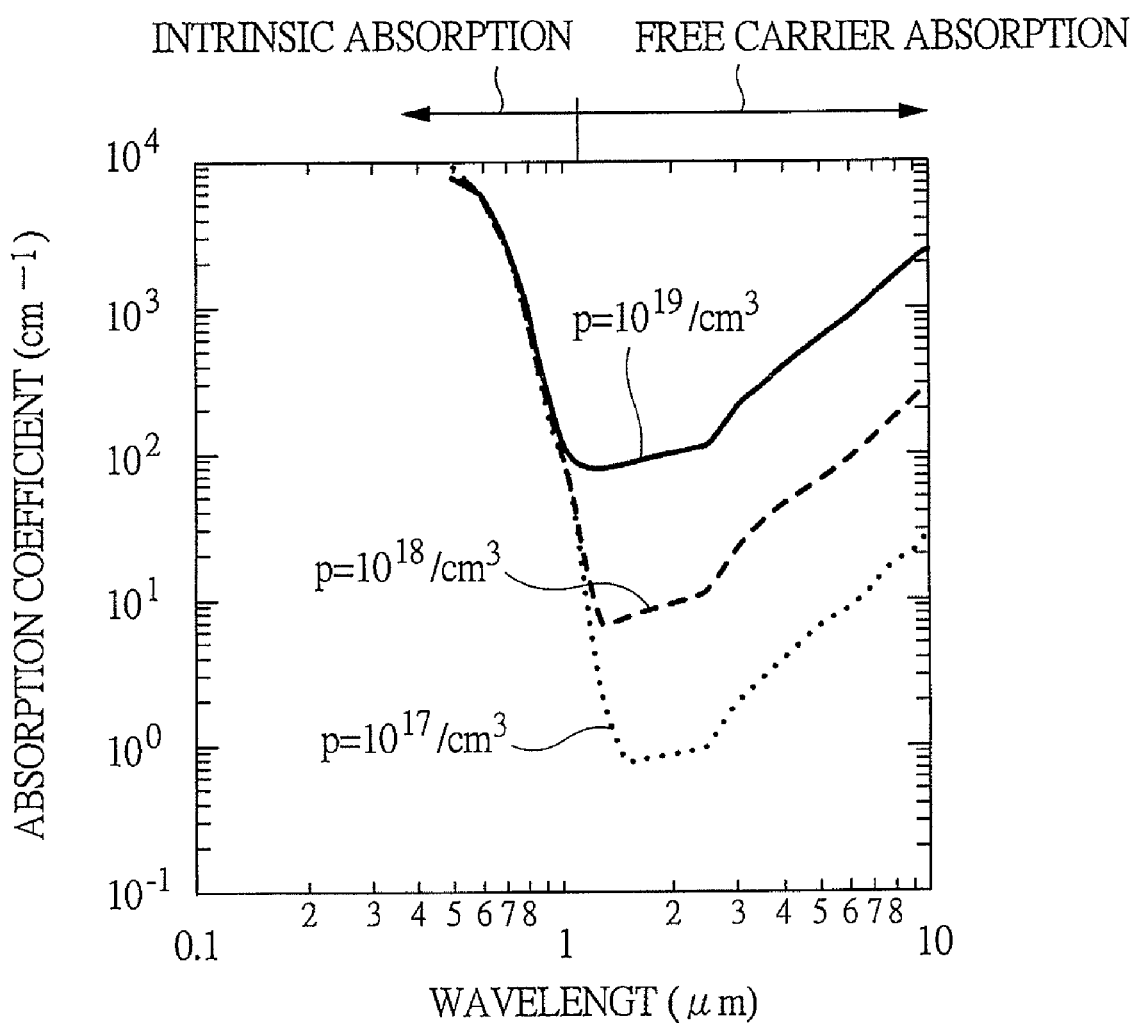
FIG. 14 is a graph showing the dependence on a wavelength with respect to absorption coefficient of silicon.
Figure 15:
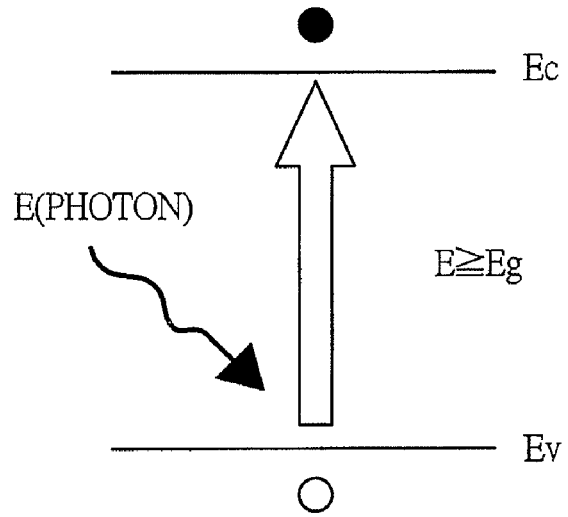
FIG. 15 is an explanatory view of the intrinsic absorption.
Figure 16:
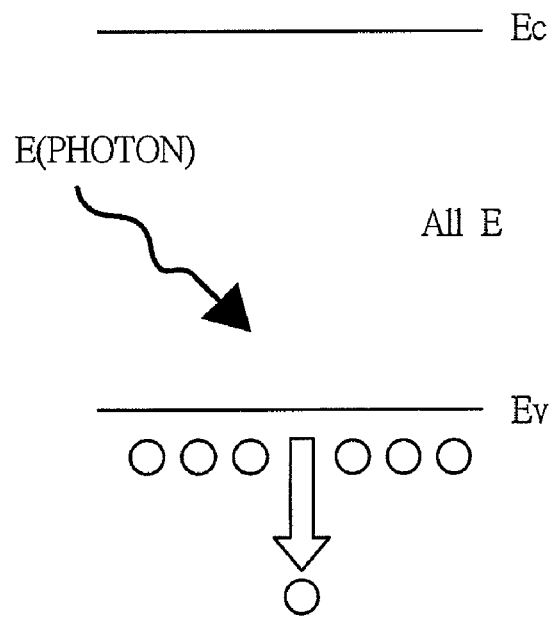
FIG. 16 is an explanatory view of the free carrier absorption.

FIG. 14 is a graph showing the dependence on wavelength with respect to an absorption coefficient of Si. Also, FIG. 15 is an explanatory view of the intrinsic absorption and FIG. 16 is an explanatory view of the free carrier absorption. The horizontal axis of the graph in FIG. 14 corresponds to a wavelength of an incident light and the vertical axis of the graph in FIG. 14 corresponds to an absorption coefficient of Si. Also, FIG. 14 shows the dependence on an incident light wavelength with respect to an absorption coefficient of Si implanted with impurities in the cases of various impurity concentrations, that is, in the three cases where the impurity concentrations p are $10^{17}/cm^3$, $10^{18}/cm^3$, and $10^{19}/cm^3$.

As is understood from the graph of FIG. 14, in a region where an incident light wavelength is comparatively short, the intrinsic absorption occurs as described in FIG. 15. Thus, since the absorption coefficient is high in a range of short incident light wavelength, Si (silicon) is easily heated, and since the absorption coefficient is low in a range of long incident light wavelength, Si is not easily heated. Meanwhile, in a region where an incident light wavelength is comparatively long, the free carrier absorption occurs as described in FIG. 16. Thus, since the absorption coefficient is low in a range of short incident light wavelength, Si is not easily heated, and since the absorption coefficient is high in a range of long incident light wavelength, Si not easily heated. Also, as is understood from the graph in FIG. 14, an absorption coefficient caused by intrinsic absorption (corresponding to an absorption coefficient in a region where an incident light wavelength is comparatively short) does not depend on the impurity concentration in Si, but an absorption coefficient caused by free carrier absorption (corresponding to an absorption coefficient in a region where an incident light wavelength is comparatively long) depends on the impurity concentration in Si and the absorption coefficient has a tendency to be increased as the impurity concentration becomes higher.

In the first embodiment, a laser with a wavelength in a range where an absorption coefficient is relatively increased by free carrier absorption, that is, a long-wavelength laser is used for the annealing after the ion-implantation. The wavelength of the laser to be used is preferably 3 μm or more, more preferably 5 μm or more, and even more preferably 8 μm or more. For instance, $CO_2$ gas laser (wavelength: 10.6 μm) can be used to perform the annealing treatment. When a long-wavelength laser is used, troubles caused when using a short-wavelength laser such as an excimer laser can be avoided. In addition, when a wavelength of a laser light is preferably set to 3 μm or more, more preferably to 5 μm or more, and even more preferably 8 μm or more, a free carrier absorption can occur easily, whereby an absorption coefficient can be comparatively increased and an annealing time (laser irradiation time) can be shortened. Further, it is also possible to raise an annealing temperature.

In the manner as described above, since a long-wavelength laser annealing is utilized for the annealing after the ion-implantation, it is possible to raise a temperature to a higher temperature in a shorter time compared to the lamp heating method and the like. Since the annealing time can be shortened, the diffusion of the implanted impurities during the annealing can be suppressed or prevented. For that reason, the junction depth of a formed impurity diffusion layer can be made shallow, which is advantageous for the downsizing and the high integration of a semiconductor device. The annealing time for the long-wavelength laser annealing is preferably 100 msec or less, more preferably 10 msec or less, and even more preferably 1 msec or less, whereby the diffusion of the implanted impurities during the annealing can be suppressed or prevented more accurately. Further, since the annealing temperature can be made high, the solid solubility (solid solubility limit) of impurities implanted in Si can be enhanced, and the resistance (resistivity) of an impurity diffusion layer after the annealing (activation of impurities) can be reduced. The annealing temperature of the long-wavelength laser annealing is preferably 1000° C. or more, more preferably 1100° C. or more, and even more preferably 1200° C. or more, whereby the resistance (resistivity) of an impurity diffusion layer after the annealing (activation of impurities) can be more accurately reduced.

Second Embodiment

In the first embodiment, the case where a silicon dioxide layer is applied to the gate insulator 7 has been described. However, in the second embodiment, the case where a high-k layer is applied to the gate insulator 7 will be described. Since the manufacturing process up to the step of forming the gate insulator 7 is the same as that of the first embodiment, the description thereof will be omitted and the manufacturing process thereafter will be described.

As shown in FIG. 1, a stacked gate insulator $HfSiO_2/HfO_2$ (high-k layer) with the thickness of about 0.5 nm/3 nm is formed as the gate insulator 7 on the surface of the p-type well 3 and the n-type well 5 by a sputtering method or a CVD method. A composition ratio of $HfSiO_2$ layer is, for example, Si/(Si+Hf)=10 to 50 atom %.

Next, as shown in FIG. 2, a metal layer made of Al, W, Ti or nitrides of these metals to be the gate electrodes 8 and 9 is formed by a sputtering method or a CVD method. For example, its thickness is 50 nm to 200 nm. Then, the metal-material gate layer is patterned into the predetermined gate electrode patterns. Note that the gate electrodes 8 and 9 are made of conductive polysilicon layers in the first embodiment.

Next, as shown in FIG. 3, in the same manner as the first embodiment, an n-type impurity such as arsenic (As) is ion-implanted (ion-implantation) into the regions on both sides of the gate electrode 8 on the p-type well 3, whereby (one pair of) n⁻-type semiconductor regions 11 (impurity diffusion layers, i.e. extension of source and drain) are formed. Further, (one pair of) p⁻-type semiconductor regions 12 are formed by ion-implanting a p-type impurity such as boron (B) in the same manner as the formation of the n⁻-type semiconductor region 11.

Next, as shown in FIG. 4, in the same manner as the first embodiment, the sidewalls 13 (sidewall spacer, sidewall insulator) made of an insulator such as a silicon dioxide layer or a silicon nitride layer or a stacked layer thereof are formed on the sidewalls of the gate electrodes 8 and 9.

Next, as shown in FIG. 5, in the same manner as the first embodiment, an n-type impurity such as arsenic (As) is ion-implanted (ion-implantation) into the regions on both sides of the gate electrode 8 and the sidewalls 13 on the p-type well 3, whereby (one pair of) n⁺-type semiconductor regions 14 (source and drain) are formed. Further, (one pair of) p⁺-type semiconductor regions 15 are formed by ion-implanting a p-type impurity such as boron (B) in the same manner as the formation of the n⁺-type semiconductor region 14.

As described above, by using the conventional photolithography and reversing the conductivity types of p type and n type in all the ion-implantation steps, the p-channel MISFET is formed, and thus, a CMIS can be formed.

A long-wavelength laser annealing is performed under the conditions at 1350° C. for 800 μs in order to activate the impurities implanted into the n⁻-type and p⁻-type semiconductor regions 11 and 12 and the n⁺-type and p⁺-type semiconductor region 14 and 15 by the ion-implantation. The long-wavelength laser annealing is an annealing treatment (heat treatment) using a laser with a long wavelength, and the wavelength of the used laser (laser light) is preferably 3 μm or more, more preferably 5 μm or more, and even more preferably 8 μm or more. For example, $CO_2$ gas laser (wavelength: 10.6 μm) can be used to perform the annealing treatment.

In this case, metal gate electrodes made of Al, W, Ti or nitrides of these metals are used and they function as a reflectance-controlling layer in the second embodiment. Since the gate electrodes 8 and 9 are not heated and only the n⁻-type and p⁻-type semiconductor regions 11 and 12 and the n⁺-type and p⁺-type semiconductor regions 14 and 15 are annealed in a self-aligned manner, the impurities implanted into the regions can be activated.

As is well-known, since a high-k layer of the gate insulator 7 has a poor heat resistance, in the high-temperature annealing for forming the source and drain having an ultra-shallow junction and a low resistance by using a conventional method such as lamp annealing, the temperature thereof is restricted to 1000° C. or less. In the second embodiment, since the gate electrodes 8 and 9 are not heated, their underlying gate insulators 7 made of a high-k layer are not directly heated. Therefore, the stable gate insulator 7 made of a high-k layer can be formed even when a source and a drain are activated at a temperature higher than conventional one.

Thereafter, although the subsequent process is performed in the same manner as the first embodiment, the description thereof will be omitted here.

Third Embodiment

In the first embodiment, the case where the annealing treatment according to the present invention is applied to the process of activating impurities has been described. However, in the third embodiment, the case where it is applied to the siliciding step will be described.

Figure 17:
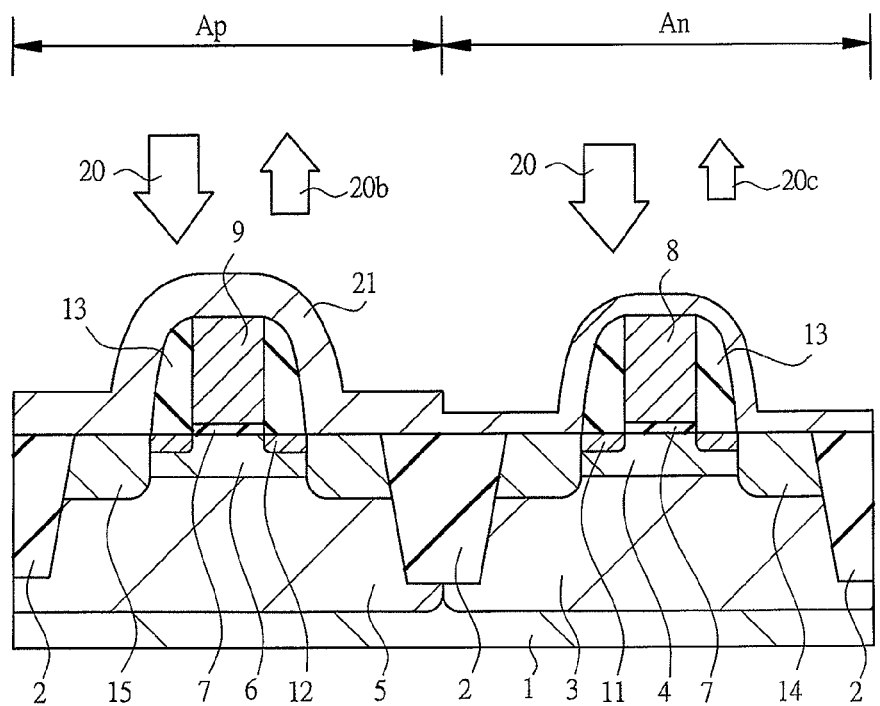
FIG. 17 is a cross-sectional view showing the principal part of a semiconductor device in a manufacturing process according to another embodiment of the present invention.
Figure 18:
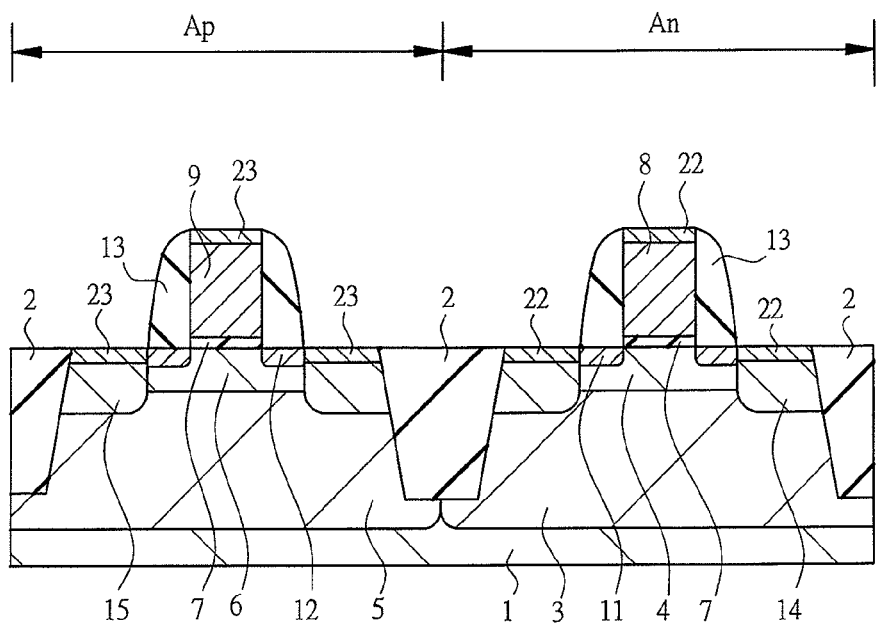
FIG. 18 is a cross-sectional view showing the principal part of a semiconductor device in a manufacturing process continued from FIG. 17.

FIG. 17 and FIG. 18 are sectional views showing the principal part in the manufacturing process of a semiconductor device according to the third embodiment. Since the manufacturing process up to the step shown in FIG. 7 is the same as that of the first embodiment, the description thereof will be omitted and the manufacturing process thereafter will be described.

As shown in FIG. 17, a nickel (Ni) layer 21 is formed to about 30 nm to 40 nm on the semiconductor substrate 1 having an nMIS formation region An and a pMIS formation region Ap by a conventional sputtering method or the like. In the third embodiment, this nickel layer 21 functions as a reflectance-controlling layer.

Then, the nickel layer 21 on the nMIS formation region An is partially removed by dry etching or wet etching using a photoresist layer as a mask so that the remaining nickel layer 21 is left on the nMIS formation region An. By doing so, the nickel layer 21 has different thicknesses in the nMIS formation region An and the pMIS formation region Ap. In FIG. 17, only the nickel layer 21 on the nMIS formation region An is made thinner, and the thickness thereof is about 10 nm to 20 nm on the nMIS formation region An and about 30 nm to 40 nm on the pMIS formation region Ap.

Then, after a TiN layer with about 10 nm thickness as an oxidation resistant layer is formed by sputtering, the long-wavelength laser annealing is performed under the condition of at 1000° C. for 800 μs in order to start the silicide reaction. Note that reflection lights 20b and 20c obtained when the laser light 20 as an incident light is reflected by the reflectance-controlling layer 17 are also shown in addition to the laser light 20 in FIG. 17.

The long-wavelength annealing is an annealing treatment (heat annealing) using a long-wavelength laser as a light source. A wavelength of the used laser (laser light) is preferably 3 μm or more, more preferably 5 μm or more, and even more preferably 8 μm or more. For example, the annealing treatment can be performed using a $CO_2$ gas laser (wavelength: 10.6 μm). Thereafter, a non-reacted nickel layer 21 and a TiN layer are removed by conventional wet etching, and then, the NiSi layers 22 and 23 are formed as shown in FIG. 18.

In this annealing treatment, the transmittance of the laser light decreases on the pMIS formation region Ap having a thicker nickel layer 21, and the effective heating temperature on the region Ap falls to 800° C. for 800 μs. Therefore, the difference in the amount of Ni reaction occurs, and the silicided layers, that is, the NiSi layers 22 and 23 can have different thicknesses in each of nMIS and pMIS as shown in FIG. 18. The thickness of the NiSi layer 22 in the nMIS is about 20 nm to 30 nm and the thickness of the NiSi layer 23 in the pMIS is about 10 nm to 20 nm.

Also, in addition to the thickness of the nickel silicide, the nickel silicide phases, for example, monosilicide or disilicide can be varied in the nMIS and the pMIS by the optimization of an annealing time.

Thereafter, although the step of the deposition of an inter-wiring insulating layer and its subsequent steps are carried out in the same manner as the first embodiment, the description thereof will be omitted here.

Fourth Embodiment

In the first embodiment, the case where the annealing treatment according to the present invention is applied to the semiconductor region (impurity diffusion layer) of CMIS has been described. However, in the fourth embodiment, the case where it is applied to the predetermined region of a semiconductor chip will be described.

Figure 19:
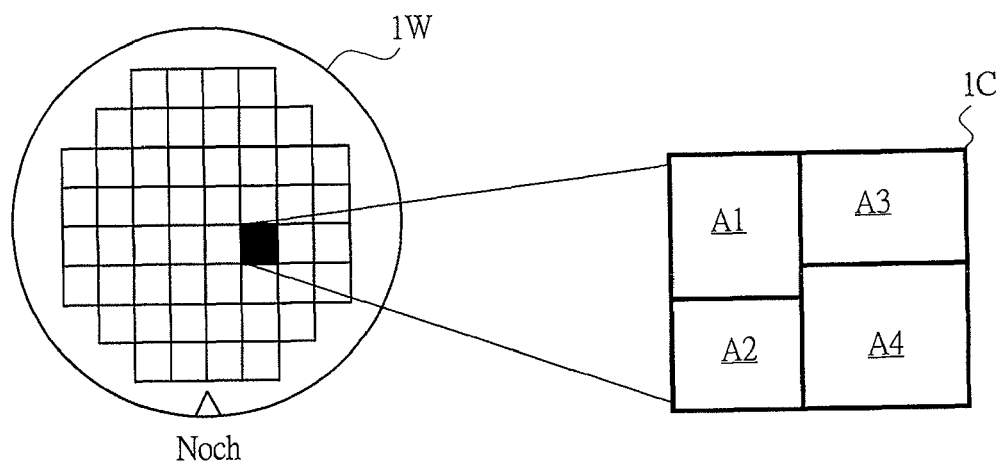
FIG. 19 is an explanatory view of a manufacturing process of a semiconductor device according to another embodiment of the present invention.

As shown in FIG. 19, a semiconductor chip 1C (semiconductor substrate) which is subjected to various steps in a state of a semiconductor wafer 1W and then cut out of the wafer includes a region A1 on which SRAMs are mainly formed, a region A2 on which flash memories and resistors are mainly formed, a region A3 on which peripheral circuits are mainly formed, and a region A4 on which bipolar transistors and DRAMs are mainly formed.

First, flash memories, resistors, peripheral circuits, bipolar transistors and DRAMS are formed through conventional manufacturing steps on the regions A2 to A4.

Then, the manufacturing process up to the ion-implantation step for forming a source and a drain of a high-speed CMIS constituting an SRAM is performed on the region A1. For example, the manufacturing process corresponds to that described with reference to FIG. 1 to FIG. 5 in the first embodiment.

Then, a surface-protection layer and a reflectance-controlling layer are formed on the whole surface of the semiconductor chip 1C having the regions A1 to A4. Thereafter, the surface-protection layer and the reflectance-controlling layer are removed only on the region A1 where SRAMs (high speed CMIS) are to be formed and left on the other regions by photolithography and etching. Then, an annealing treatment is performed to the region A1 by the long-wavelength laser annealing.

Then, the remaining surface-protection and reflectance-controlling layers are removed from the whole surface of the chip. Thereafter, SRAMs, flash memories, resistors, peripheral circuits, bipolar transistors, DRAMs and others are formed through the subsequent steps. In this manner, an LSI (semiconductor device) is formed.

It is also possible to apply the annealing treatment according to the present invention to an LSI having MISFET memories (SRAMs, DRAMs, flash memories), peripheral I/O circuits, bipolar circuits and others on one semiconductor chip 1C. In this case, by selectively removing the surface-protection layer and the reflectance-controlling layer only on a region where an extension layer having ultra-shallow junction and low resistance is to be formed and then performing the laser annealing, a MISFET having an extension layer with ultra-shallow junction and low resistance can be formed without deteriorating the characteristics of the elements formed on other regions.

Conventionally, in a so-called Bi-CMIS LSI having both the CMIS circuit and bipolar circuit, in order to prevent the bipolar transistor from being deteriorated by heat loads in forming the source and drain of the CMIS, the CMIS is first formed and then the bipolar transistor is formed. However, since heat loads in forming the source and drain of the CMIS can be reduced by applying the present invention, it becomes possible to form the CMIS after forming the bipolar transistor, and the degree of freedom in the process design can be improved.

Also, in the case where a memory cell of DRAM and a CMIS logic circuit are mounted in one chip, in order to prevent the memory cell of DRAM from being deteriorated by heat loads in forming the source and drain of the CMIS, the CMIS is first formed and then the memory cell of DRAM is formed. In this case, since there are many steps for forming the memory cell of DRAM, there is a problem that the characteristics of the CMIS formed previously are gradually deteriorated by the many heat treatments included in the process of manufacturing a DRAM. However, since the CMIS can be formed after forming the memory cell of DRAM by applying the present invention, the deterioration in characteristics of a CMIS can be prevented. Also, since heat loads in forming the source and drain of the CMIS can be reduced, even when the CMIS is formed after forming the memory cell of DRAM, the deterioration in the memory cell of DRAM can be prevented.

Fifth Embodiment

In the first embodiment, the case where the annealing treatment according to the present invention is applied to the predetermined region of an Si substrate as a semiconductor substrate has been described. However, in the fifth embodiment, the case where it is applied to an SiC substrate will be described.

In order to control the surface contamination of an SiC substrate, the SiC substrate is covered with a mask material of about 10 to 20 nm, and impurities for controlling conductivity are then implanted into the SiC substrate through the mask material. The impurity elements are one element or plural elements selected from, for example, N, P, As, B, Al, Ga, Be, S, V, O, C, Si and others. Note that, if a uniform impurity density distribution to a certain depth is required like a source and a drain of CMIS, it is necessary to perform a multi-level ion implantation using the energy of two or more levels.

The ion implantation is performed at a room temperature or under a high temperature condition in a range of 100° C. to 1000° C. Particularly, in the case where a high-concentration impurity diffusion layer locally formed by the ion implantation is required in order to form an ohmic serving as a current input and output of a semiconductor device, the ion implantation at a high temperature is desirable in order to reduce residual defects caused by the high-concentration ion implantation as much as possible.

As the mask material, an $SiO_2$ layer formed when the SiC surface is subjected to thermal oxidation or an $SiO_2$ layer deposited by a CVD method is desirable. This mask material is a reflectance-controlling layer whose reflectance to the irradiation of a light having a particular wavelength becomes lower as the thickness thereof becomes thinner.

After the ion implantation, a long-wavelength laser light having a wavelength of 3 μm or more is irradiated to the SiC substrate. For example, an annealing treatment is performed using a $CO_2$ gas laser (wavelength: 10.6 μm), whereby an ion-implantation layer (semiconductor region) can be formed. For instance, the annealing conditions are set at 1750° C. for 2000 μs, and the substrate is heated in a range from 100° C. to 400° C. in irradiating the laser light. Since these laser lights have a longer penetration length into the SiC substrate than a KrF and an XeCl laser, it is possible to activate a deeper ion-implantation layer.

Figure 20:
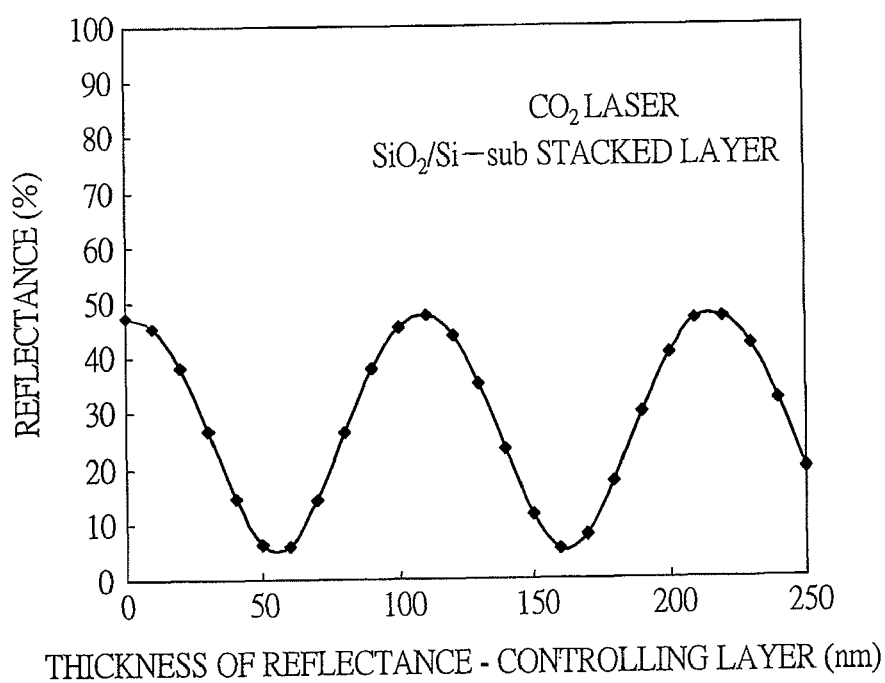
FIG. 20 is an explanatory view showing the dependence on thickness of a reflectance-controlling layer with respect to the reflectance variation of a long-wavelength laser in an SiC substrate.

As shown in FIG. 20, when compared with the case where the laser light is irradiated to a substrate having no reflectance-controlling layer (reflectance: 50%), the reflectance of a laser light largely fluctuates due to the effects of multiple reflections and interferences among the outermost layer (for example, inert gas atmosphere), the reflectance-controlling layer and the SiC substrate. Therefore, a reflectance can reduced by the optimization of the thickness of a reflectance-controlling layer (thickness of 50 nm in FIG. 20). In other words, the annealing can be performed so that a laser light is effectively absorbed into an ion-implantation layer.

Figure 21:
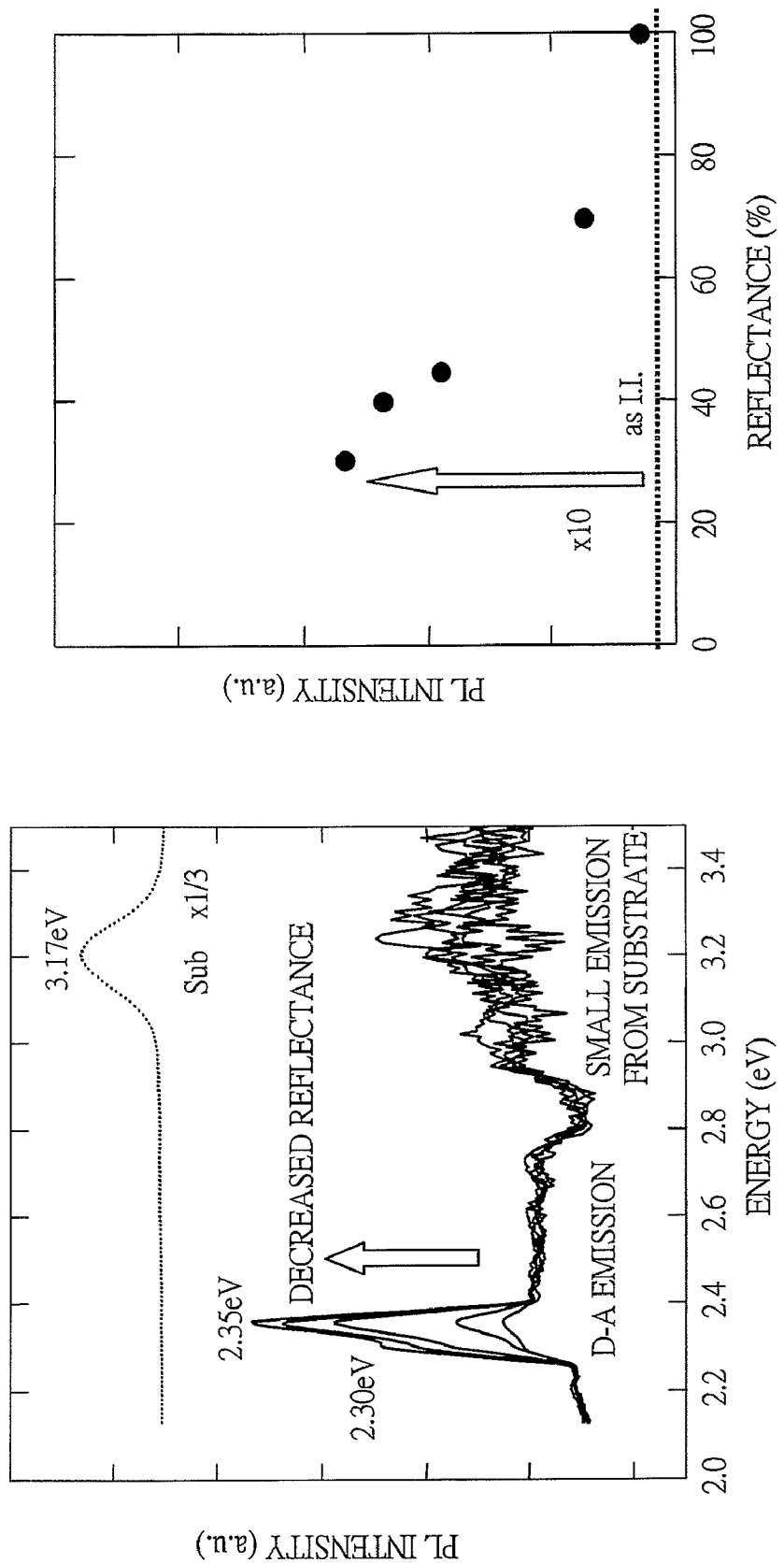
FIG. 21 is an explanatory view showing the dependence on a reflectance with respect to photoluminescence spectra of impurity diffusion layers formed by ion implantation and long-wavelength laser annealing on an SiC substrate.

FIG. 21 shows the measurement results of photoluminescence spectra for confirming the degree of impurity activation after annealing the several ion-implanted SiC substrates each having different reflectances resulting from the difference in thickness of the reflectance-controlling layer. The ion-implantation is performed under the conditions of Al, 150 keV and $1\times10^{16}/cm^2$, and the measurement is carried out by a YAG laser (wavelength: 266 nm) excitation at room temperature. As a reflectance becomes lower and the amount of light absorbed by an SiC substrate increases, light emission intensity by the recombination between a donor and an acceptor resulting from impurity elements is increased. In other words, the increase in the activated impurities can be observed.

According to the method described above, since the annealing process can be performed without exposing the surface of the semiconductor substrate to the outermost layer, it is possible to prevent the evaporation of the surface composition elements of a semiconductor substrate, the degradation of heat efficiency due to the heat radiation from the substrate surface, and the surface contamination due to adhering substances.

Further, the application to the process of performing the ion implantation and electrode deposition with a common mask material, that is, a so-called self-alignment process is also possible.

Furthermore, by using the impurity activation method as described above, various types of semiconductor elements such as a diode and a CMIS based on SiC can be formed.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the case where the present invention is applied to an ultra-shallow junction has been described in the first embodiment. However, the present invention can be applied to the activation of a deep impurity diffusion layer formed by increasing the acceleration energy in the ion implantation.

Further, the case where the annealing is preformed selectively to an nMIS formation region or a pMIS formation region of a CMIS has been described in the first embodiment. However, the present invention can be applied to the case where a layer formation region deposited by CVD, PVD, or sputtering is selectively annealed in a chip to change the layer characteristics of that part.

Furthermore, the case where the annealing treatment is applied to semiconductor regions to be a source and a drain of a MISFET has been described in the first embodiment. However, the annealing treatment can be applied to semiconductor regions to be an emitter and a base of a bipolar transistor.

The present invention can be widely utilized in a manufacturing industry of semiconductor devices.

What is claimed is:

1. A method of manufacturing a semiconductor device, comprising the steps of:
   (a) forming a reflectance-controlling layer whose reflectance to irradiation of light from a light source becomes lower as a thickness thereof becomes thinner on a semiconductor substrate including a first region and a second region;
   (b) etching the reflectance-controlling layer on the first region; and
   (c) after the step (b), annealing the first region by irradiating the light to the semiconductor substrate,
   wherein, before the step (a), a bipolar transistor is formed on the second region, and
   after the step (b), a MISFET is formed on the first region.

2. A method of manufacturing a semiconductor device, comprising the steps of:
   (a) forming a reflectance-controlling layer whose reflectance to irradiation of light from a light source becomes lower as a thickness thereof becomes thinner on a semiconductor substrate including a first region and a second region;
   (b) etching the reflectance-controlling layer on the first region; and
   (c) after the step (b), annealing the first region by irradiating the light to the semiconductor substrate,
   wherein, before the step (a), a memory cell is formed on the second region, and
   after the step (b), a MISFET is formed on the first region.

* * * * *